(12) United States Patent
Yamanobe

(10) Patent No.: US 6,342,337 B1
(45) Date of Patent: Jan. 29, 2002

(54) FERROELECTRIC MEMORY CELL FABRICATION METHOD

(75) Inventor: Tomomi Yamanobe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/460,988

(22) Filed: Dec. 15, 1999

(30) Foreign Application Priority Data

Jun. 8, 1999 (JP) .......................................... 11-160638

(51) Int. Cl.$^7$ ......................... G03F 7/00; H01L 21/302
(52) U.S. Cl. ..................... 430/314; 430/313; 430/317; 430/318; 430/320; 257/295; 438/3; 438/692; 216/52
(58) Field of Search ............................... 430/313, 314, 430/317, 318, 320; 257/295; 438/3, 692; 216/52

(56) References Cited

U.S. PATENT DOCUMENTS

| | | | |
|---|---|---|---|
| 4,944,836 A | 7/1990 | Beyer et al. ................ 156/645 |
| 5,387,539 A | 2/1995 | Yang et al. ................... 437/67 |
| 5,701,647 A | * 12/1997 | Saenger ..................... 29/25.42 |
| 5,913,117 A | 6/1999 | Lee ............................ 438/240 |
| 6,081,417 A | * 6/2000 | Matsuki ..................... 361/311 |
| 6,093,575 A | * 7/2000 | Eguchi .......................... 438/3 |
| 6,194,752 B1 | * 2/2001 | Ogasahara .................. 257/295 |

OTHER PUBLICATIONS

Shibeo Onishi et al., "A Half–Micron Ferroelectric Memory Cell Technology with Stacked Capacitor Structure," 1994 IEEE, IEDM 94-843, pp. 34.4.1-34.4.4.

Yukihiko Maejima et al., "Low–damage ECR–plasma–etching Technique for SrBi2Ta2O9 (SBT) Capacitor in FeRAM Devices," 1997 Symposium on VLSI Technology Digest of Technical Papers, pp. 137-138.

* cited by examiner

Primary Examiner—Mark F. Huff
Assistant Examiner—Nicole Barreca
(74) Attorney, Agent, or Firm—Volentine Francos, PLLC

(57) ABSTRACT

A method for fabricating ferroelectric memory cells includes forming a first interlayer insulating film having a first opening on an underlayer, and forming a preparatory first electrode layer over the entire surface thereof. The preparatory first electrode layer is partially removed in a CMP process and a first electrode is formed by the remaining portion. Next, a second interlayer insulating film having a second opening that exposes the first electrode is formed. Portions of a preparatory ferroelectric film on the exposed surface of the first electrode and the upper surface of the second interlayer insulating film are formed mutually stepped. The portion of the preparatory ferroelectric film on the second interlayer insulating film is removed by a CMP process and the portion on the exposed surface is left remaining to form a ferroelectric film. A second electrode is formed on the ferroelectric film by CMP processing or photolithography.

27 Claims, 9 Drawing Sheets

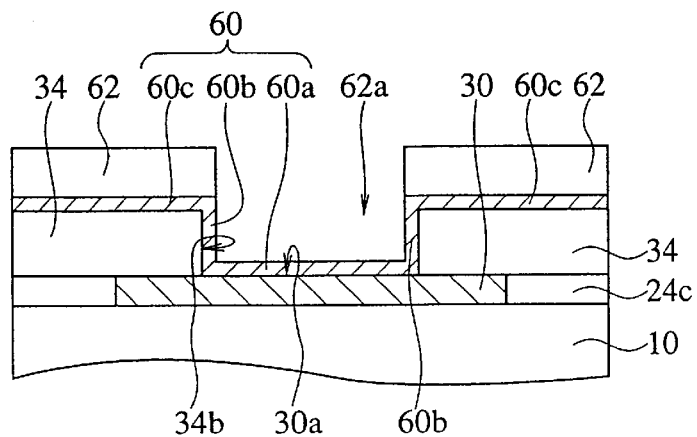
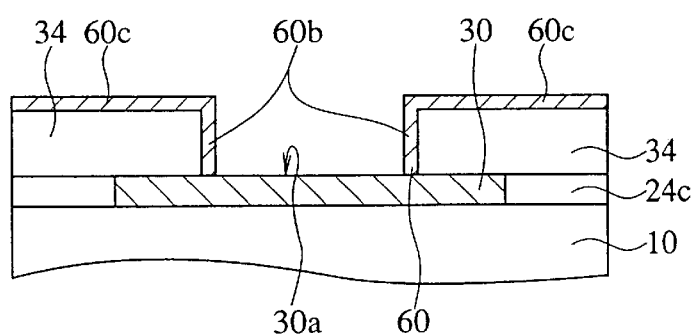
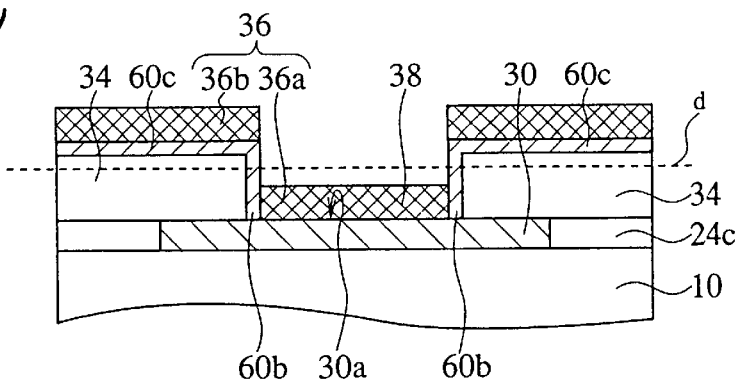
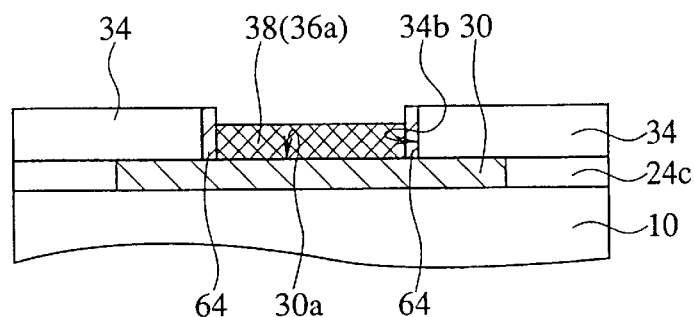

FERROELECTRIC MEMORY CELL FABRICATION METHOD

BACKGROUND OF THE INVENTION

1. Field of the Invention

The present invention relates to semiconductor memory devices, and particularly to a method of fabricating ferroelectric memory cells.

2. Description of Related Art

Ferroelectric bodies are materials that exhibit spontaneous polarization which can be reversed by an electric field. Such materials are used in forming semiconductor memory devices. For example, by replacing the ordinary dielectric material in DRAM capacitors with ferroelectric material, ferroelectric memory cells are configured.

The 1T1C and 2T2C type structures are known as general structures for such ferroelectric memory cells. In the 2T2C structure, two transistors and two capacitors are combined to configure one memory cell. What is characteristic of this 2T2C ferroelectric memory cell is that conflicting data, like an inverted signal and a non-inverted signal, are written to two ferroelectric capacitors, that strong durability is exhibited to fatigue wherein the polarization quantity is diminished by rewrite frequency, and that the stable operation of the memory cell involved is secured. However, the surface area occupied by each cell is large, making the 2T2C structure unsuitable for high integration.

Meanwhile, the 1T1C structure is being developed in the interest of achieving high integration by reducing cell occupation area, and research on this structure is currently being ongoing. Ferroelectric memory cells having the 1T1C structure present many problems that need to be resolved, such as the necessity of generating a reference potential in order to distinguish between a binary "1" and a binary "0," and the necessity of making further improvements in order to obtain stable operation in these memory cells.

In order to enhance ferroelectric memory cell integration, the capacitors wherein the ferroelectric material is used must be made very minute. The technology required for such microfabrication is dry etching technology. When ferroelectric materials and the electrode materials used in the capacitors are etched to form patterns thereof, respectively, the configuring elements react with the etching gas to produce reaction products. In most cases, these reaction products have a low vapor pressure, wherefore the reaction products build up on the patterns, without being vaporized. As a result, the desired minute or fine patterns cannot be formed.

As is commonly known, platinum (Pt) has been used up until now as the primary electrode material for evaluating ferroelectric thin films. Because platinum does not readily form reaction products with the etching gas, etching residue builds up, during etching, in the peripheral areas on the upper surface of the platinum patterns formed. (See reference "S. Onishi, et al.: 'technology. dig. Int. Electron Devices Meet., (IEDM)' 1994, pp 843–846.")

Meanwhile, when $SrBi_2Ta_2O_9$ (abbreviated SBT) is used as the ferroelectric material, the etching of this material with $BCl_3$, which is more reductive than $CL_2$, is known. $BCl_3$ provides an etching rate that is better than that provided by $Cl_2$. When $BCl_3$ is used in this etching, however, the edge surfaces of the patterns formed do not become perpendicular surfaces but rather become sloped or bevel surfaces. When the pattern edge surfaces are sloped surfaces, adverse effects are imposed on the ferroelectric material configuring the capacitors. (See reference "Y. Maejima, et al.: 'Symposium on VLSI Technology Digest of Technical Papers,' 1997, pp 137–138.")

As discussed in the foregoing, the build-up of reaction products and the build-up of etching residue hinders the minute processing or microfabrictation of ferroelectric materials and electrode materials.

There is also a danger that the reaction products built up on the electrode patterns formed will cause current leakage to the capacitor periphery.

Also, the edge regions of ferroelectric patterns to be formed by dry etching are exposed to plasma during the etching. As a consequence, the crystalline structure of and atomic arrangement in the ferroelectric material are greatly damaged by that plasma. For this reason, when capacitors are formed using the ferroelectric material that has been damaged in this manner, there is a danger that the electrical characteristics such as the amount of charge therein (i.e. the polarization quantity) will be different from the amount of charge designed.

SUMMARY OF THE INVENTION

An object of the present invention is to provide a method for microfabricating or minutely processing electrode materials and ferroelectric materials to form ferroelectric memory cells without producing build-up and without damaging the ferroelectric patterns formed.

In a first aspect of the present invention, a first electrode and a dielectric film that configure a capacitor are formed using a CMP (chemical mechanical polishing) technique instead of using an etching technique.

More specifically, according to this first aspect, a method of fabricating a ferroelectric memory cell comprising a first and a second electrode, and a ferroelectric film interposed between that first and second electrode, includes following steps of:

forming a preparatory first electrode layer either on or above an underlayer;

removing a portion of the preparatory first electrode layer, using a first CMP (chemical mechanical polishing) technique, and forming the first electrode by the remaining or residual portion of the preparatory first electrode layer;

forming a preparatory ferroelectric film above the underlayer on which the first electrode is formed, causing a portion thereof to come in contact with the first electrode; and removing that portion of the preparatory ferroelectric film that does not come in contact with the first electrode using a second CMP (chemical mechanical polishing) technique, and forming the ferroelectric film with the remaining or residual portion of the preparatory ferroelectric film.

According to this method, the first electrode material and the ferroelectric material are minutely of finely patterned by CMP to form the first electrode and the ferroelectric film, wherefore there will be no adherence of build-up matter on the patterns formed, and the edge surfaces of the ferroelectric film can be formed as perpendicular surfaces. Accordingly, it is possible to obtain capacitors that are highly reliable.

According to a second aspect of the present invention, after forming the ferroelectric film, a second electrode as a member of a capacitor is formed using a CMP (chemical mechanical polishing) technique instead of using an etching technique.

More specifically, a method for fabricating a ferroelectric memory cell based on this second aspect comprises steps of:

forming a preparatory second electrode layer above the underlayer on which the ferroelectric film has been formed, causing a portion thereof to come in contact with the ferroelectric film; and removing the portion of the preparatory second electrode layer that does not make contact with the ferroelectric film, using a third CMP (chemical mechanical polishing) technique, and forming the second electrode with the remaining or residual portion of the preparatory second electrode layer.

According to this method, minute or fine patterning is done with CMP to form the second electrode, wherefore there will be no build-up matter adhering to the pattern formed. Accordingly, capacitors can be obtained which are highly reliable.

According to a third aspect of the present invention, after forming the ferroelectric film, the second electrode as a member of the capacitor is formed using an etching technique.

More specifically, a method for fabricating a ferroelectric memory cell based on this third aspect comprises steps of:

forming a preparatory second electrode layer above the underlayer on which the ferroelectric film has been formed, causing a portion thereof to come in contact with the ferroelectric film; and removing the portion of the preparatory second electrode layer that does not make contact with the ferroelectric film, using a photolithographic etching technique, and forming the second electrode with the remaining or residual portion of the preparatory second electrode layer.

According to this method, the second electrode is formed using a photolithographic etching technique, therefore making it possible to allow greater tolerance in matching the second electrode with the ferroelectric film formed earlier. Accordingly, it is possible to obtain capacitors that are highly reliable.

According to a fourth aspect of the present invention, barrier layers are formed between the ferroelectric film and the other layers.

If barrier layers are formed or provided beforehand in this manner, it is possible to prevent reactions between the ferroelectric film other than the first and second electrodes and insulating layers, etc., and other layers that make contact therewith during heat treatment for crystallizing the ferroelectric film, wherefore deterioration in the quality of the ferroelectric film can be prevented. Accordingly, it is possible to obtain capacitors that are highly reliable. ographic etching.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

A detailed description is now given of the ferroelectric memory cell fabrication method of the present invention with reference to the drawings. These drawings are represented as manufacturing process drawings. The drawings representing the process stages are shown as cross-sections of structures obtained in each of those process stages. These drawings merely provide simplified representations of the shapes, sizes, and layout of the configuring or constitutional elements to an extent wherewith the present invention can be comprehended. The embodiments described below, moreover, are merely preferred examples. It should therefore be understood that the present invention is not in any way limited to or by these embodiments. For example, the materials used, numerical values, and fabrication conditions, etc., are in no way limited to that represented here so long as the configuration of the present invention can thereby be realized.

Furthermore, the following embodiments are described, as an example, for a 1T1C type memory cell. A ferroelectric memory cell ordinarily has a capacitor that is configured of a first and a second electrode and of a ferroelectric film interposed between those electrodes, as well as a transistor such as a MOS transistor for controlling the capacitor operation. The present invention particularly relates to a method for fabricating this capacitor, wherefore the description mainly concerns that point.

FIG. 1 (including FIGS. 1(A) to 1(L)) is a series of manufacturing process diagrams provided for explaining a first embodiment of the ferroelectric memory cell fabrication process of the present invention.

Figure 1A:
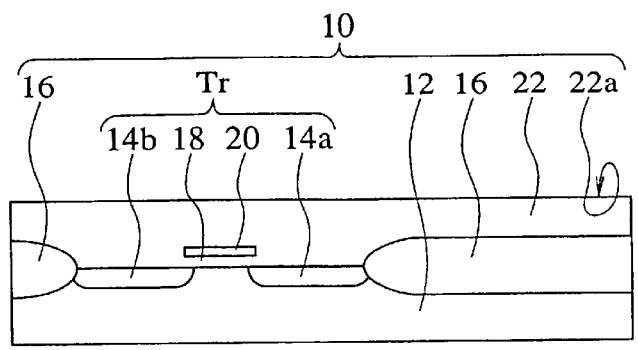
FIG. 1 (including FIGS. 1(A) to 1(L)) is a series of manufacturing process diagrams provided for explaining a first embodiment of the ferroelectric memory cell fabrication process of the present invention, FIG. 2 (including FIGS. 2(A) to 2(I)) is a series of partial manufacturing process diagrams for describing a second embodiment of the present invention, FIG. 3 (including FIGS. 3(A) to 3(D)) is a series of partial manufacturing process diagrams for describing a third embodiment of the present invention, FIG. 4 (including FIGS. 4(A) to 4(F)) is a series of partial manufacturing process diagrams for describing a fourth embodiment of the present invention.
Figure 1B:
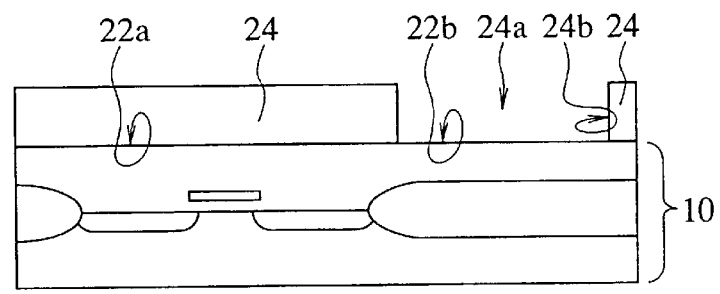

First, an underlayer 10 for forming a capacitor is prepared (FIG. 1(A)). This underlayer 10 can be made a single layer, a lamination or stacked layer, or a layer wherein is formed a region for a transistor or other element. In this embodiment, a layer having already formed thereto regions for an element is used as the underlayer. This underlayer 10 has an ordinary conventional structure. In this underlayer, first and second main electrode regions 14a and 14b and an isolation region or layer 16 are formed at a suitable substrate 12 that is a silicon substrate or the like. A control electrode 20 is formed on the upper surface of this substrate 12 with interposing a gate insulating film 18 therebetween. A first interlayer insulating film 22 is formed as a surface insulating film over the entire surface of the substrate on the control electrode 20 side. The upper surface 22a of this first interlayer insulating film 22 is the upper surface of the underlayer. This upper surface 22a ordinarily constitutes a flat surface. These configuring components 14a, 14b, 18, and 20 mainly configure a MOS transistor Tr.

Figure 1C:
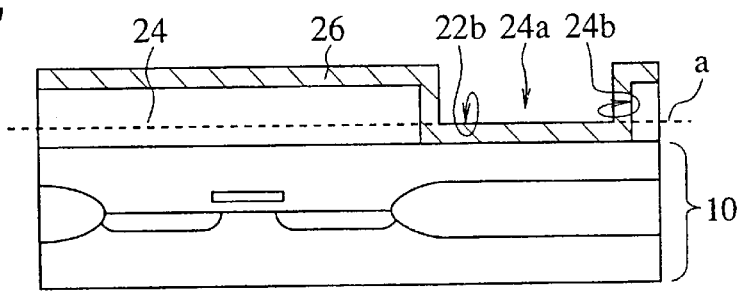

A preparatory first electrode layer 26 is formed on the upper surface 22a side of this underlayer 10 (FIG. 1(C)). The formation of this preparatory first electrode layer is implemented as follows. First, a dummy insulating layer 24 having a first opening 24a is formed on the upper surface 22a of the underlayer 10 using a photolithographic etching technique (FIG. 2(B)). This first opening 24a exposes a first electrode formation intended region (exposed surface) 22b in a region in the upper surface 22a of the underlayer. A silicon oxide film of $SiO_2$, for example, is used as the dummy insulating layer. On this oxide film may be formed a resist pattern and the oxide film may be subjected to an etching process, using a fluorine-based gas wherewith anisotropic etching is possible, for example, to form the first opening 24a. The side wall surface 24b of the dummy insulating layer 24 defining this first opening 24a constitutes a substantially perpendicular surface relative to the upper surface of the underlayer. In this embodiment, moreover, the first opening 24a is made above the isolation region.

Next, a first electrode material is sputtered onto the surface of this dummy insulating layer 24 and on the exposed surface 22b to form the preparatory first electrode layer 26 with a suitable film thickness in accordance with the design. It is preferable that this first electrode material be a material that is stable in an oxygen atmosphere at temperatures of 600° C. or so or higher. The reason for this is that it is necessary that the electrode material does not deteriorate in the annealing done in a later process to crystallize the ferroelectric material. Platinum (Pt) is an example of a substance that can be used for this electrode material. Other examples include iridium (Ir), ruthenium (Ru), and oxides thereof. Such oxide conductors as SrRuO and LaSrCoO may also be used. In this embodiment, platinum is used.

Figure 1D:
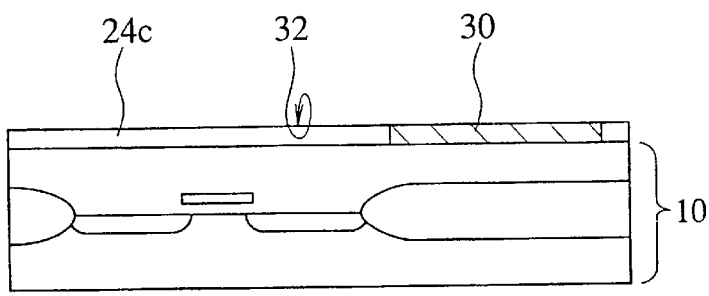
Figure 1E:
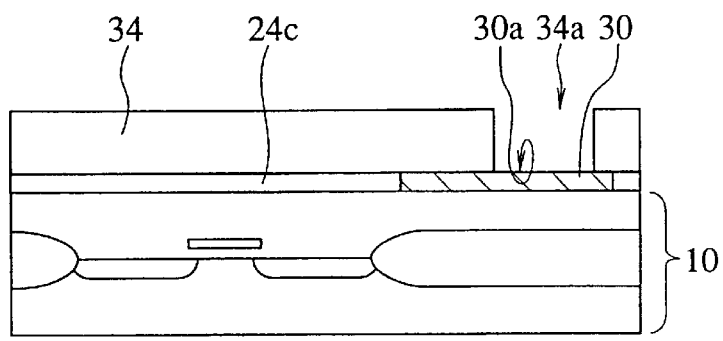

Next, a portion of this preparatory first electrode layer 26 is removed, and a first electrode 30 is formed by the remaining or residual portion of the preparatory first electrode layer (FIG. 1(D)). Here, for this removal process, a CMP (chemical mechanical polishing) technique is employed. CMP processing is also used in a later process step, so the CMP used here is called the first CMP.

CMP is a procedure for making the surface of a wafer flat wherein, after arranging a table holding a polishing cloth called a pad, and a wafer secured to a holder so that their faces are in opposition, the table and wafer are caused to turn relative to one another while a polishing fluid called slurry is supplied. In this CMP, the polishing surface is flattened both by mechanical polishing and by the chemical polishing resulting from the reaction between the polishing surface material and the slurry.

In this embodiment, the preparatory first electrode layer 26 is a platinum layer, wherefore it is preferable that the slurry be a hydrochloric acid-based aqueous solution. Using this slurry, polishing is performed from the upper surface of the preparatory first electrode layer 26 to the underlayer side. This polishing is done down to the level a indicated by the broken line in FIG. 1(C). In other words, it is done down to the level a at the upper surface of the preparatory first electrode layer portion that is formed on the bottom surface of the first opening 24a, that is, on the upper exposed surface of the underlayer. By this polishing, the portion of the preparatory first electrode layer 26 that is formed on the dummy insulating layer 24 is removed, while the dummy insulating layer 24 is also removed down to the depth of this level.

As a result, the structure shown in FIG. 1(D) is obtained. Residual portion of the preparatory first electrode layer obtained by this first CMP becomes the first electrode 30. A substantially flat surface 32 is formed by the upper surface of this first electrode 30 and the upper surface (i.e. the polished surfaces) of the remaining or residual portion 24c of the dummy insulating layer. This first electrode 30 is not affected by the CMP process, wherefore the electrical properties thereof are not impaired.

Figure 1F:
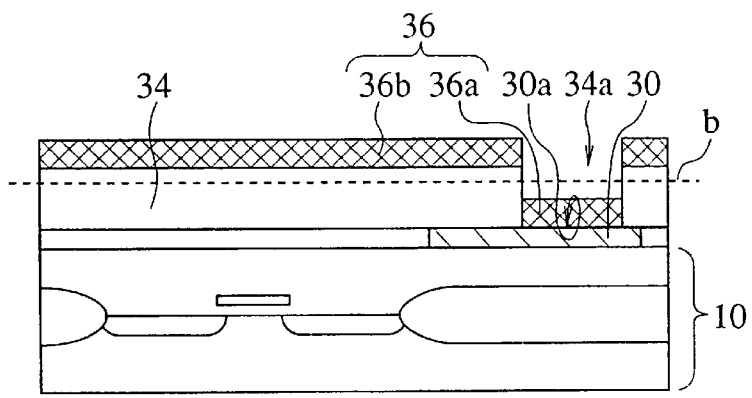

Next, on the upper side of the underlayer 10 whereon this first electrode 30 is formed, preparatory ferroelectric films 36 (36a and 36b) are formed (FIG. 1(F)). For that reason, first, on this flat surface 32, a second interlayer insulating film 34 having a second opening 34a that exposes the first electrode layer 30 is formed, using a photolithographic etching technique (FIG. 1(E)). This second interlayer insulating film 34 may be formed using the same material and etching gas as for the dummy insulating layer 24. In the second opening 34a, a portion of the upper layer of the first electrode 30 is exposed. This exposed surface 30a is the intended formation region for the ferroelectric film. In this case, the difference in height (step) between the upper surface of this second interlayer insulating film 34 and the exposed surface 30a of the first electrode 30 is made larger than the thickness of the ferroelectric film that is to be formed on the exposed surface 30a.

Next, on the upper surface of the second interlayer insulating film 34 and on the exposed surface 30a, a preparatory ferroelectric film 36 having a suitable film thickness suitable for the design is formed (FIG. 1(F)). At this time, the portion that is left remaining as the ferroelectric film is provided with the portion been contacted with this exposed surface 30a. The material used for this preparatory ferroelectric film 36 should preferably be SBT (abbreviation for $SrBr_2Ta_2O_9$), for example. The annealing temperature for crystallizing this material is 700° C. or so or higher. A sol-gel solution or a MOD (organic metal) solution of this ferroelectric is coated onto the upper surface of the second interlayer insulating film 34 and on the exposed surface 30a of the first electrode 30. This coating should preferably be done by spin coating. This preparatory ferroelectric film 36 has the step described above, wherefore it is separately formed on the exposed surface 30a of the first electrode 30 and on the second interlayer insulating film 34. Accordingly, the portion of this preparatory ferroelectric film 36 that is above the exposed surface 30a, that is, the portion making contact with the first electrode 30, is designated 36a, while the portion thereof above the second interlayer insulating film 34, that is, the portion not contacting the first electrode, is designated 36b.

Figure 1G:
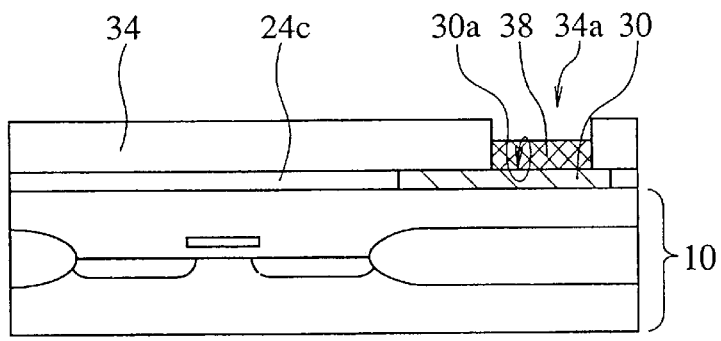
Figure 1H:
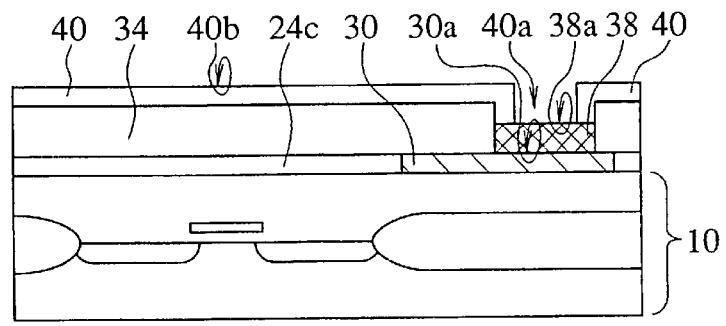
Figure 1I:
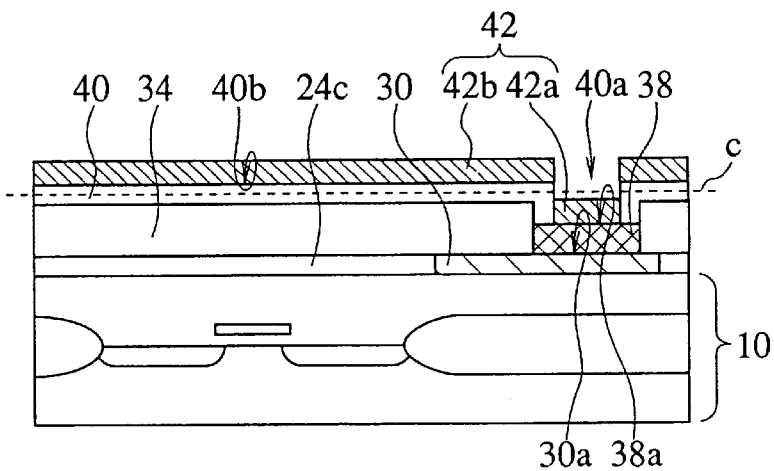

After that, the portion 36b of the preparatory ferroelectric film 36 that does not make contact with the first electrode 30 is removed using a CMP technique. The remaining portion 36a that is in contact with the first electrode 30 is obtained as a ferroelectric film 38 (FIG. 1(G)). In order to distinguish this from the CMP used in forming the first electrode, the CMP in this instance is called the second CMP. By this second CMP, polishing is performed down to the level indicated by the broken line b in FIG. 1(F) and the non-contacting portion 36b is removed. Following thereupon, if necessary, by this second CMP, the portion from the upper surface of the second interlayer insulating film 34 on the lower side thereof is removed down to the depth of level b. That is, the portion of the second interlayer insulating film 34 positioned higher than the level of the upper surface of the contacting portion 36a is removed, and the structure shown in FIG. 1(G) is obtained. The polished surface of the remaining or residual second interlayer insulating film 34 constitutes a flat surface.

In this embodiment, the ferroelectric material is made SBT (abbreviation for $SrBr_2Ta_2O_9$), wherefore the slurry used in this second CMP should preferably be an ammonia-based aqueous solution, for example. Also, since the polishing process with this second CMP is done so that the upper surface of the contacting portion 36a of the preparatory ferroelectric film described above is not reached, direct contact of the upper surface of this contacting portion 36a, that is, of the exposed surface, with the pad that does the mechanical polishing, is held down to a minimum. For this reason, the ferroelectric film 38 obtained sustains substantially no mechanical damage from the polishing process. Therefore the reliability of the ferroelectric film in terms of its electrical properties can be secured.

Depending on the ferroelectric material, moreover, in some cases it will be preferable to form the ferroelectric film 38 by sputtering. Therefore, the formation of the preparatory ferroelectric film 36 is not limited to any coating method at all. It is also possible to use a material for which the annealing temperature for effecting crystallization is 600–700° C. or so, such as PZT (abbreviation for $Pb(Zr_{1-x}Ti_x)O_3$), for example, or any other suitable ferroelectric material.

Figure 1J:
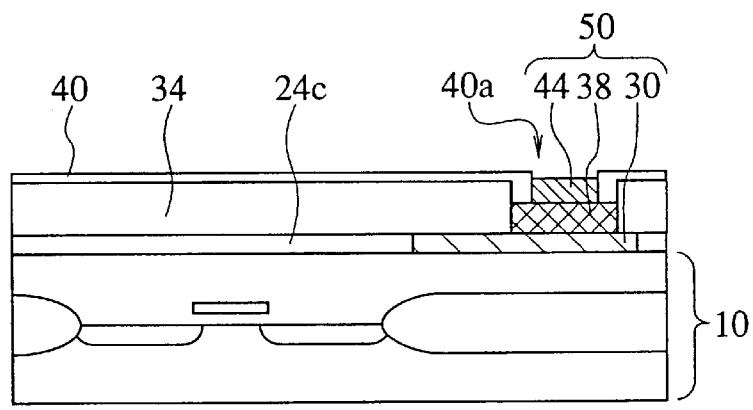

After forming the ferroelectric film 38, in this manner, a second electrode 44 is formed (FIG. 1(J)). For this purpose, first, on the surface above the underlayer 10 whereon the ferroelectric film 38 has been formed, a third interlayer insulating film 40 wherein is formed a third opening 40a for exposing the upper surface 38a of the ferroelectric film 38 is formed to a suitable thickness, using photolithographic etching (FIG. 1(H)). The exposed surface 38a of the ferroelectric film inside this third opening 40a is the intended region for the formation of the second electrode.

After that, on the upper side of the underlayer 10 whereon is formed the ferroelectric film 38, that is, on the upper surface 40b of the third interlayer insulating film 40 and the upper surface 38a of the ferroelectric film 38, a preparatory second electrode layer 42 is formed. The portion of this preparatory second electrode layer 42 that is on the upper surface 38a of the ferroelectric film 38 is designated 42a, and the portion thereof on the upper surface 40b of the third interlayer insulating film 40 is designated 42b (FIG. 1(I)). It is preferable that platinum (Pt) be used as the material for forming this second electrode. This platinum is sputtered to form the preparatory second electrode layer 42. The preparatory second electrode layer portion 42a is formed so that it contacts the upper surface of the ferroelectric film 38, while the other portion 42b thereof is formed so that it does not make contact with the ferroelectric film 38. That is, the portions 42a and 42b are formed so that they are divided by a step. It is also possible to use the same material as used for the first electrode material, instead of platinum, for the second electrode material, such as, for example, Ir, Ru, $SrRuO_2$, or LaSrCoO, etc.

Following thereupon, the second preparatory electrode layer 42 thus formed is partially removed and the remaining or residual portion 42a forms the second electrode 44. For this purpose, using a CMP technique, the portion 42b is removed by polishing and the third interlayer insulating film 40 below the portion 42b is partially removed by polishing. The CMP in this case is called the third CMP to distinguish it from the first and second CMP. It is well that the slurry used in this third CMP be a hydrochloric acid-based aqueous solution, as in the case of the second CMP, because the electrode material is platinum. Also, this polishing is performed from the upper surface of the portion 42b of the second preparatory electrode layer 42 to the level indicated by the broken line c in the drawing, that is, to a level that does not reach the upper surface of the portion 42a of the second preparatory electrode layer 42. By this third CMP, the structure of a capacitor 50 is obtained on the underlayer 10, that is, the structure shown in FIG. 1(J) comprising the lower first electrode 30, the ferroelectric film 38, and the upper second electrode 44.

Figure 1K:
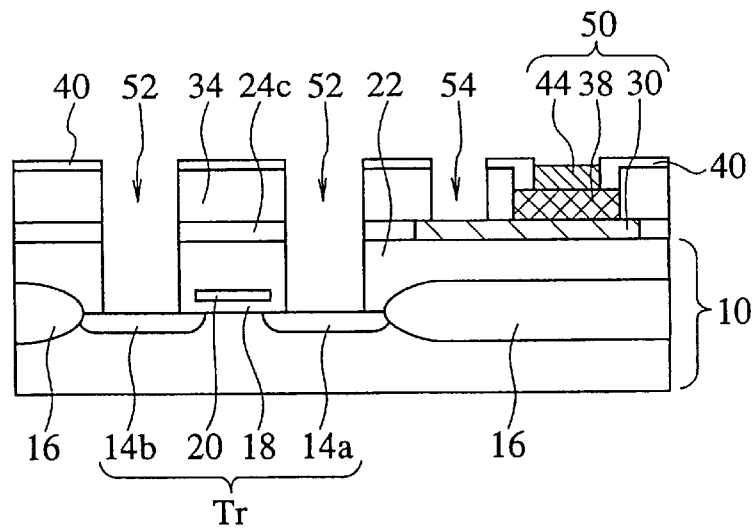
Figure 1L:
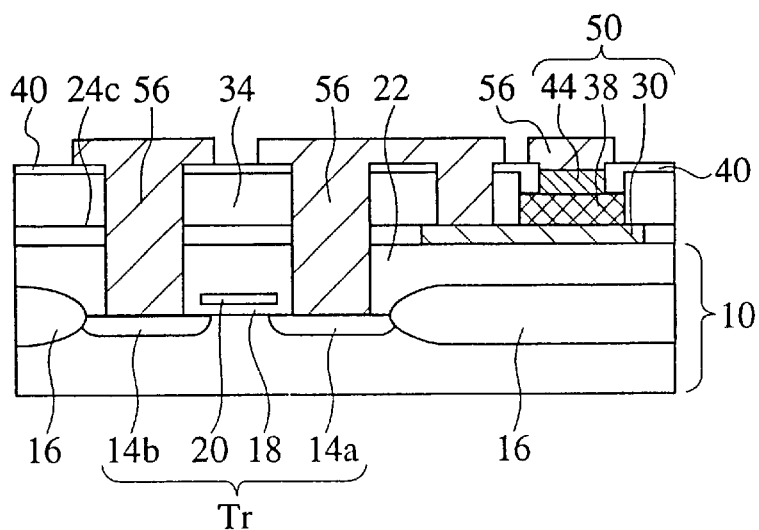

After that, contact holes 52 for the MOS transistor Tr and contact hole 54 to the first electrode 30 of the capacitor 50 are formed by a conventional and known etching method (FIG. 1(K)).

After that, a wiring or interconnection pattern 56 is formed by sputtering and etching, using any suitable electrically conducting material such as aluminum, so that interconnection is implemented according to the design. In the embodiment shown in FIG. 1(L), the first main electrode of the MOS transistor Tr and the first electrode 30 of the ferroelectric capacitor 50 are connected by this interconnection 56 and thus a ferroelectric memory cell is formed (FIG. 1(L)). Also, although no mention has been made here of the annealing done to crystallize the ferroelectric film, this annealing may be performed at any of a number of times, such as after forming the preparatory ferroelectric film, or after CMP-polishing the preparatory ferroelectric film, or, alternatively, after forming the contact hole to the ferroelectric film but prior to forming the metal wiring or interconnection.

According to this first embodiment of the present invention, as described in the foregoing, every time a ferroelectric capacitor is formed that is made up of three layers, namely a first electrode, a ferroelectric film, and a second electrode, an opening is formed in the region intended for the formation of the electrodes or ferroelectric film after forming an interlayer insulating film. Then, after that, and after forming the preparatory electrode layer or the preparatory ferroelectric film, using that opening, the electrode pattern or the ferroelectric film pattern is formed, using a CMP technique. In particular, the preparatory ferroelectric film is formed so as to control the thickness of the ferroelectric film, and so that a step is formed between the upper surface of the film formed inside the opening and the upper surface of the interlayer insulating film outside the opening. Accordingly, when CMP polishing is performed, it is possible to hold down to a minimum any mechanical damage inflicted by the CMP pad directly contacting the upper surface of the ferroelectric film. Thus the ferroelectric film properties can be stably reproduced and the reliability thereof enhanced.

The material used in the interlayer insulating film is usually $SiO_2$, for example, or some other material wherewith anisotropic processing is easy, wherefore minute or fine openings can be formed. Also, the preparatory ferroelectric film formed is polished by CMP, and the electrode pattern or ferroelectric film pattern is left remaining so as to be formed inside the opening. For this reason, unlike the conventional case wherein formation is effected by dry etching, there is no danger of a build-up of etching residue or other non-volatile reaction products, etc. It is therefore possible to form electrode patterns or ferroelectric film patterns that are more minute or fine than those formed conventionally.

Furthermore, the side walls of the interlayer insulating films (using an $SiO_2$ film in every case) that form the opening can easily be formed, using known technology, so that they are perpendicular to the flat surface below. Accordingly, unlike conventionally, the edge surfaces of the electrode patterns or ferroelectric film patterns do not become sloped or bevel surfaces. With CMP polishing, moreover, the upper surface of the ferroelectric film is not exposed to the plasma. Hence the upper surface of the ferroelectric material configuring a capacitor does not suffer damage, wherefore the ferroelectric properties do not deteriorate. For this reason, there is a possibility that the process of annealing in an oxygen atmosphere may become unnecessary in order to avoid damage to the ferroelectric film. As a consequence, it becomes possible to reduce the number of process steps in manufacturing the ferroelectric memory cells.

Next, a second embodiment of the ferroelectric memory cell fabrication method of the present invention is described. FIG. 2 (including FIGS. 2(A) to 2(I)) is a series of partial manufacturing process diagrams for describing this second embodiment. In FIG. 2, constitutional components that are the same as constitutional components shown in FIG. 1 are designated by the same symbols and, except where necessary, no detailed description thereof is given here. In FIG. 2, in particular, such constitutional components as the MOS transistor on the underlayer are omitted, the underlayer is diagrammed in simplified form, and the process diagrams are presented with a focus on the components configuring the ferroelectric capacitor.

Ordinarily, the ferroelectric formed as a film is subjected to annealing in an oxygen atmosphere and at a temperature of 700° C. or so or higher to crystallize the ferroelectric. There is a danger that, during this annealing process, mutual reactions will occur between the ferroelectric and the other layers about the periphery thereof so that the desired characteristics are not obtained in the ferroelectric. That being so, in this second embodiment, examples are mainly given wherein barrier layers are formed about the periphery of the ferroelectric film for the purpose of preventing such mutual reactions.

Figure 2A:
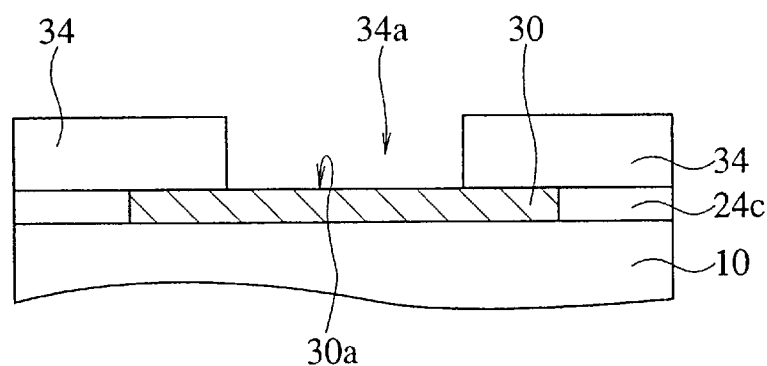

As in the first embodiment, a second interlayer insulating film 34 is formed on a flat surface formed on an underlayer 10 by a MOS transistor and the remaining or residual portion 24c of a dummy layer and first electrode 30 (FIG. 2(A)). This second interlayer insulating film has a second opening 34a in the region intended for the formation of the ferroelectric film. In this second opening 34a, the upper surface of the first electrode 30 is exposed.

Figure 2B:
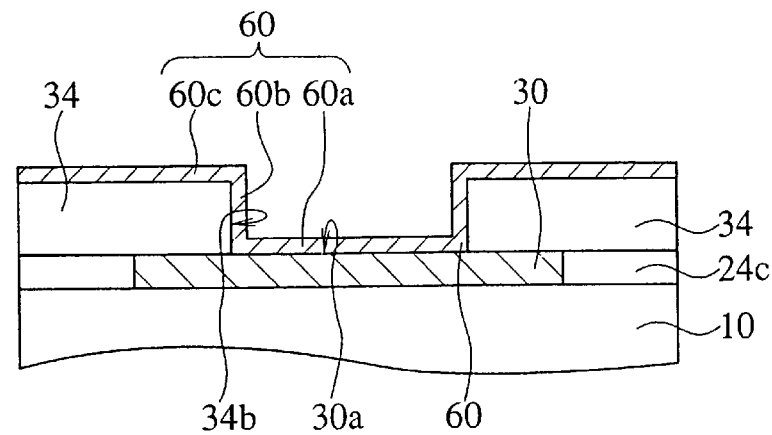

A preparatory barrier layer 60 is formed, by sputtering, on the exposed surface 30a of this first electrode 30 and on the surface of the second interlayer insulating film 34 (FIG. 2(B)). The portion of this preparatory barrier layer 60 formed on the exposed surface 30a is designated an exposed surface portion 60a, the portion thereof formed on the side wall surface 34b of the second interlayer insulating film 34 is designated a side wall portion 60b, and the portion thereof formed on the upper surface of the second interlayer insulating film 34 is designated an upper surface portion 60c. It is preferable that a layer being an oxide of titanium (Ti) or an oxide of aluminum (Al), for example, is used as the preparatory barrier layer 60. Alternatively, the preparatory barrier layer may be formed of a suitable material such as TiN, TiW, Ta, TaN, or TaSi, etc.

A resist pattern 62 is formed, using an ordinary photolithographic technique, on the upper side of this preparatory barrier layer 60, and particularly on the upper side of the upper surface portion 60c. What should be carefully noted here is that, by the resist pattern 62 being formed so as to cover the edge surface areas of the upper side of the side wall portion 60b, only the upper surface of the exposed portion 60a and the side walls of the side wall portion 60b are exposed from the resist pattern 62 (FIG. 2(C)). The opening in this resist pattern 62 is designated 62a in the figure.

After that, the exposed portion 60a that is exposed in the opening 62a is removed by etching, using the resist pattern 62 as a mask, by an anisotropic etching technique, from the perpendicular direction, and, thereafter, the resist pattern 62 is removed (FIG. 2(D)).

Next, a preparatory ferroelectric film 36 (36a and 36b) is formed on the exposed surface 30a of the exposed first electrode 30 and on the upper sides of the edge surface portions of upper surface portion 60c and side wall portion 60b of the preparatory barrier layer 60, respectively (FIG. 2(E)). This preparatory ferroelectric film 36 can be formed by the same method and using the same materials as in the case of the first embodiment. Alternatively, depending on the ferroelectric material used, it may be formed by a sputtering or CVD method. The film thickness of this preparatory ferroelectric film 36 preferably should be such that the upper surface of the portion 36a formed on the exposed surface 30a does not reach the upper surface of the second interlayer insulating film 34. In other words, as in the case of the first embodiment, by making the thickness of the preparatory ferroelectric film 36 thinner than the height difference between the upper surface of the second interlayer insulating film 34 and the exposed surface 30a, the preparatory ferroelectric film 36 is formed so that the portion 36a and portion 36b thereof are stepped.

The preparatory ferroelectric film 36 formed is subjected to pre-sintering to vaporize the organic components and then subjected to sintering proper to effect crystallization.

After that, at least the preparatory ferroelectric film portion 36b and the preparatory barrier layer 60c on the second interlayer insulating film 34 are removed by polishing by the second CMP, or, in addition, a portion of the second interlayer insulating film therebelow is removed by polishing by the second CMP (FIG. 2(F)). In this case, polishing is done from above, down to the level indicated by the broken line d in FIG. 2(E), that is, down to a level that does not reach the upper surface of the preparatory ferroelectric film portion 36a. It is possible, by effecting second CMP polishing to such a level as this, to avoid inflicting mechanical damage on the ferroelectric film that is to configure the capacitor, as in the case of the first embodiment. Even if mechanical damage is inflicted, moreover, it can be held down to a minimum such that there will be no substantial effect on the characteristics of the ferroelectric film. Finally, using such CMP polishing, the side wall portion 60b of the preparatory barrier layer at the surface 34b of the walls surrounding the second opening 34a is left remaining to form a barrier layer 64, and, simultaneously, the ferroelectric film 38 is formed enclosed by this side wall portion 60b at the surrounding side surfaces. That is, the ferroelectric film 38 is formed such that the exposed surface part 36a of the preparatory ferroelectric film 36 is left remaining.

Figure 2G:
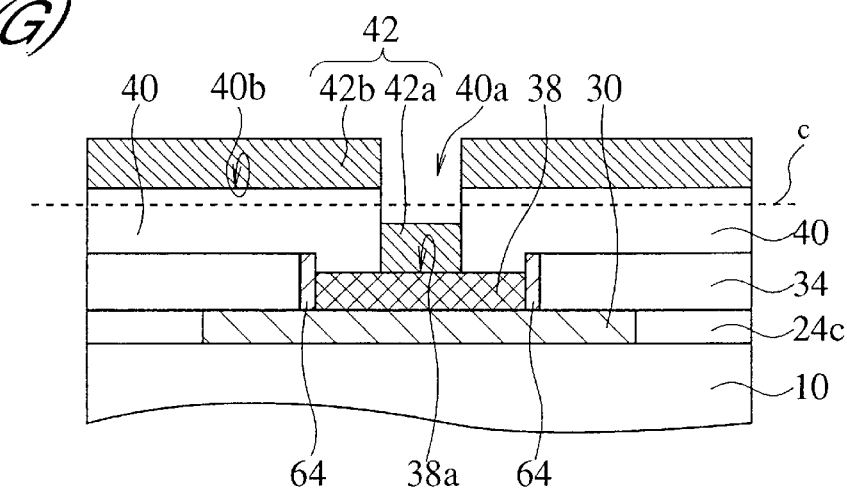

Next, using the same materials as described for the first embodiment, and performing the same processing, a third interlayer insulating film 40 is formed that is provided with a third opening, and a preparatory second electrode layer 42 (42a and 42b) is formed on the third interlayer insulating film 40 and on the ferroelectric film 38 (FIG. 2(G)).

Figure 2H:
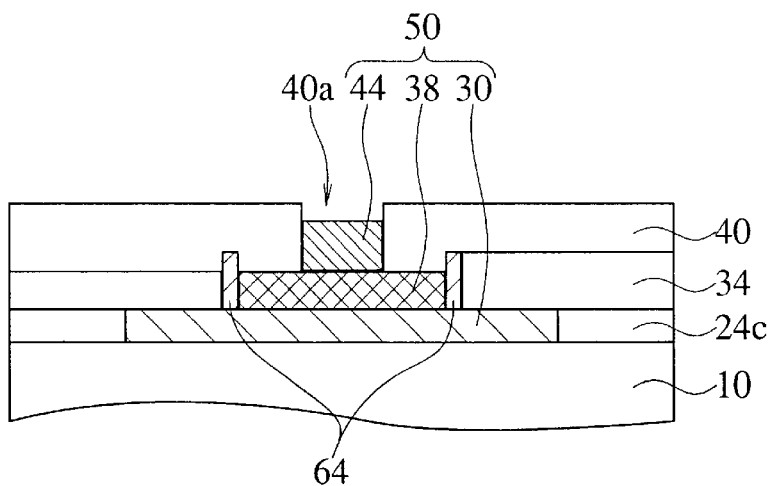
Figure 2I:
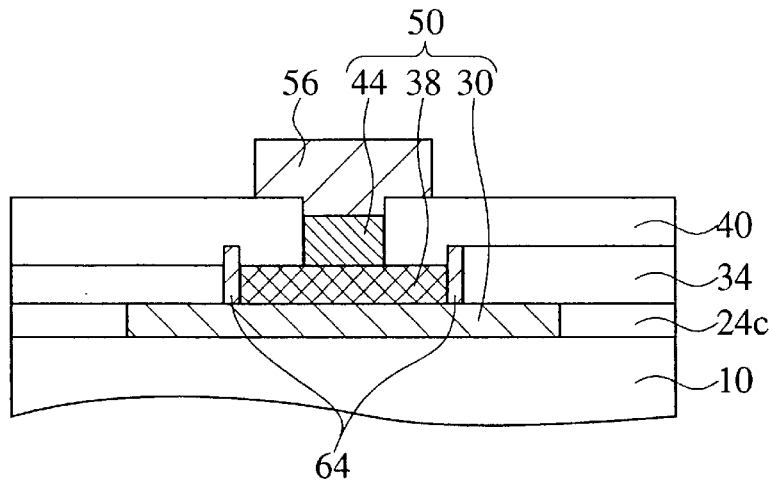

Next, the same third CMP process described for the first embodiment is performed, and the preparatory second electrode layer portion 42a is left remaining as the second electrode 44 (FIG. 2(H)). After that, in the same manner as described in the first embodiment, the required contact hole or holes are made and the required wiring or interconnection pattern 56 is formed to yield the structure as shown in FIG. 2(I). This barrier layer formation process can naturally be applied to 1T1C memories, 2T2C memories, or shrink memories.

Thus, in the second embodiment, after forming a barrier layer 64 between the ferroelectric film 38 and the interlayer insulating film 34, the ferroelectric film is subjected to annealing and the ferroelectric film is made a crystalline film of good quality. For this reason, even if the ferroelectric film 36a (or 38) are subjected to high-temperature treatment during annealing, there is no direct contact with the surrounding interlayer insulating film 34, wherefore no undesirable mutual reactions will occur between the ferroelectric film and the interlayer insulating film. Therefore, according to this second embodiment, in addition to the benefits of the first embodiment, it is possible to use ferroelectric materials that must be crystallized at high temperature. As a consequence, the range of materials that may be selected and which are suitable for flattening by CMP is broadened. Not only can this annealing be performed prior to CMP-polishing the preparatory ferroelectric film, as described in the foregoing, but it may also be performed after subjecting the preparatory ferroelectric film to CMP polishing, or, alternatively, it may be performed after forming the contact hole or holes for the ferroelectric capacitor but prior to forming the metal wiring.

A third embodiment of the ferroelectric memory cell fabrication method of the present invention is described next. FIG. 3 (including FIGS. 3(A) to 3(D)) is a series of partial manufacturing process diagrams for describing this third embodiment. In FIG. 3, constitutional components that are the same as constitutional components as shown in FIG. 1 and FIG. 2 are designated by the same symbols and, except where necessary, no detailed description thereof is given here. In FIG. 3, in particular, as in the case of FIG. 2, such constitutional components as the MOS transistor on the underlayer are omitted, the underlayer is diagrammed in simplified form, and the process diagrams are presented with a focus on the components configuring the ferroelectric capacitor.

Figure 3A:
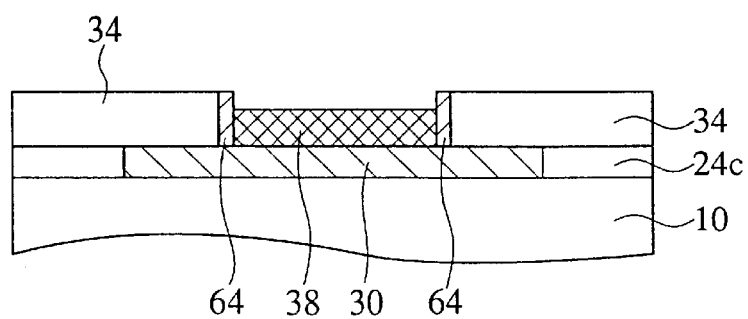
Figure 3B:
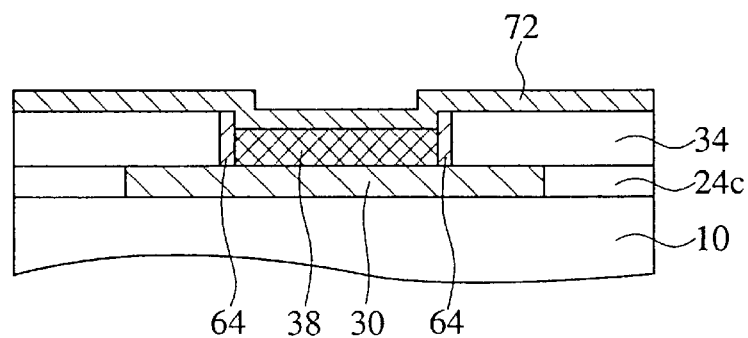
Figure 3C:
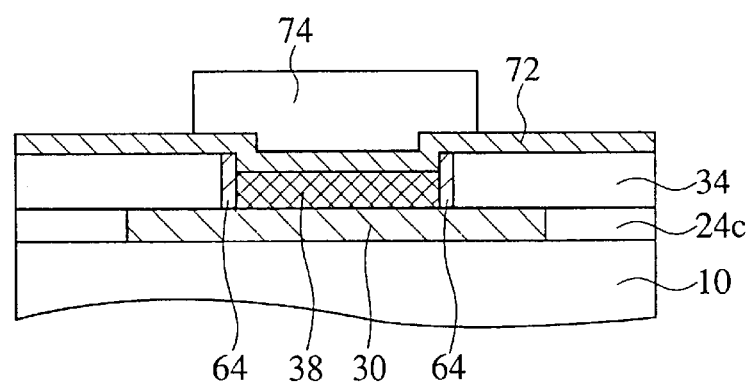

In this third embodiment, as in the case of the second embodiment, an example is described wherein a barrier layer is formed. This third embodiment, nevertheless, can be applied in examples such as the first embodiment wherein no barrier layer is foremd. In this third embodiment, furthermore, the processes up to and including the structure shown in FIG. 2(F) can be effected by the same processes as in the second embodiment, wherefore no detailed description thereof is given here. That being so, the structure shown in FIG. 3(A) is the same as the structure as shown in FIG. 2(F).

In this third embodiment, the second electrode is formed using an ordinary photolithographic etching technique instead of using a CMP technique. This is done in order to be able to realize greater tolerance in matching the second electrode with the ferroelectric film pattern than is realizable with CMP. The method of this third embodiment is particularly effective in cases where the ferroelectric pattern is 1 μm square or smaller.

First, a preparatory second electrode layer 72 is formed over the entire surface on the side where the ferroelectric film 38, barrier layer 64, and second interlayer insulating film 34 are formed. This preparatory second electrode layer preferably should be formed using the same material as in the cases of the first and second embodiments, to any suitable film thickness according to the design (FIG. 3(B)).

After that, a resist pattern 74 is formed using a photolithographic technique. In this case, the resist pattern is formed at the position where the preparatory second electrode layer portion is to be left remaining as the second electrode (FIG. 3(C)).

Figure 3D:
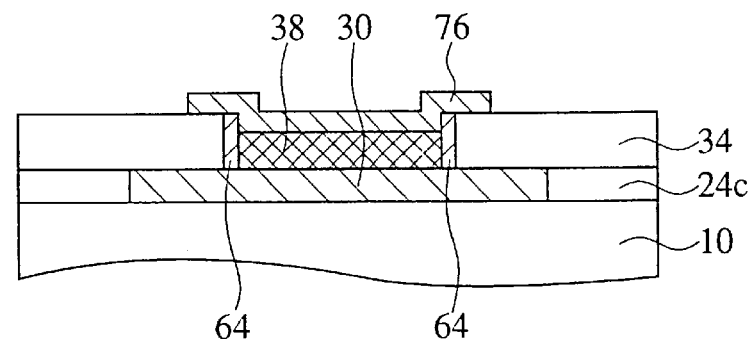

After that, using the resist pattern 74 as a mask, the exposed portion of the preparatory second electrode layer 72 is removed by etching and, thereafter, the resist pattern 74 is removed. Thus the remaining preparatory second electrode layer portion becomes a second electrode 76 and the structure as shown in FIG. 3(D) is obtained. A capacitor structure comprising the first electrode 30, ferroelectric film 38, and second electrode 76 is thereby obtained.

Next, the required contact holes and the required pattern (both being not shown in the drawings) are formed, as in the first and the second embodiments.

The processes in this third embodiment naturally can be applied to 1T1C memories, 2T2C memories, or shrink memories.

According to the third embodiment described in the foregoing, the second electrode 76 can be formed irrespective of the surface area size of the ferroelectric film 38. For that reason, the material used for the second electrode can be one that is difficult to etch, wherewith controlling the amount of over-etching is difficult, and wherewith dimensional control is difficult. Also, matching tolerance can be realized with a contact pattern for making electrical connection with the second electrode, wherefore contact with the metal layer can be effected even when the region of the ferroelectric film pattern is smaller than 1 μm square.

A fourth embodiment of the ferroelectric memory cell fabrication method of the present invention is described next. FIG. 4 (including FIGS. 4(A) to 4(F)) is a series of partial manufacturing process diagrams for describing this fourth embodiment. In FIG. 4, constitutional components that are the same as constitutional components shown in FIG. 1 and FIG. 2, are designated by the same symbols and, except where necessary, no detailed description thereof is given here. In FIG. 4, in particular, the process diagrams are presented with a focus on the components configuring the ferroelectric capacitor.

In this fourth embodiment, unlike in the second embodiment, an example is described wherein a barrier layer is formed below the first electrode. In this fourth embodiment, moreover, the same structure, i.e. underlayer, as that shown in FIG. 1(A) is prepared, and the processes subsequent thereto are described, but no further diagramming for some of the processes for the same stages as described in the first and second embodiments is given.

In this fourth embodiment, a ferroelectric memory cell fabrication method is described wherein the first main electrode such as the drain region of a MOS transistor Tr is electrically connected directly to the ferroelectric capacitor via a plug electrode.

Figure 4A:
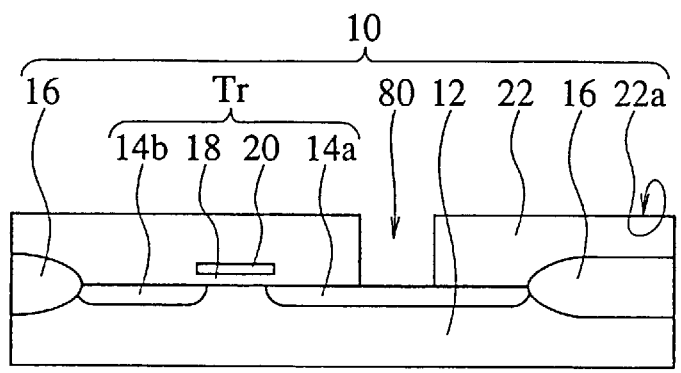
Figure 4B:
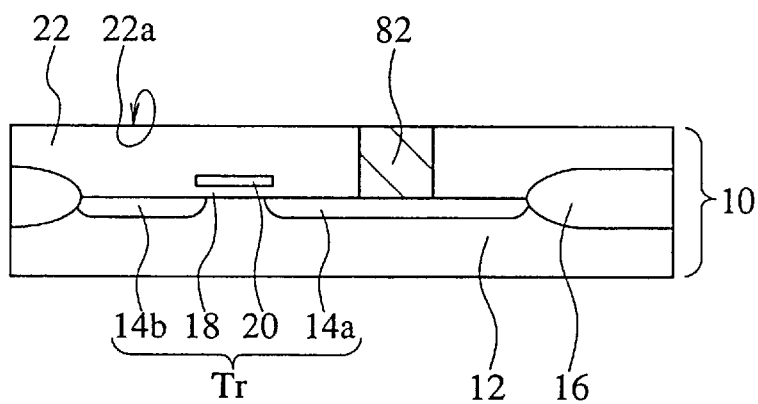

First, a contact hole 80 that reaches to the region of the first main electrode of the transistor Tr is formed on the first interlayer insulating film, that is, on the surface insulating layer 22, of the underlayer 10 (FIG. 4(A)). This contact hole is formed using a known conventional photolithographic etching technique.

Next, this contact hole 80 is filled up to the level of the upper surface 22a of the surface insulating layer with any suitable conducting material to form a plug electrode 82. This plug electrode 82 makes direct contact with the first main electrode (FIG. 4(B)). Tungsten or polycrystalline silicon, for example, can be used for this plug electrode material.

Figure 4C:
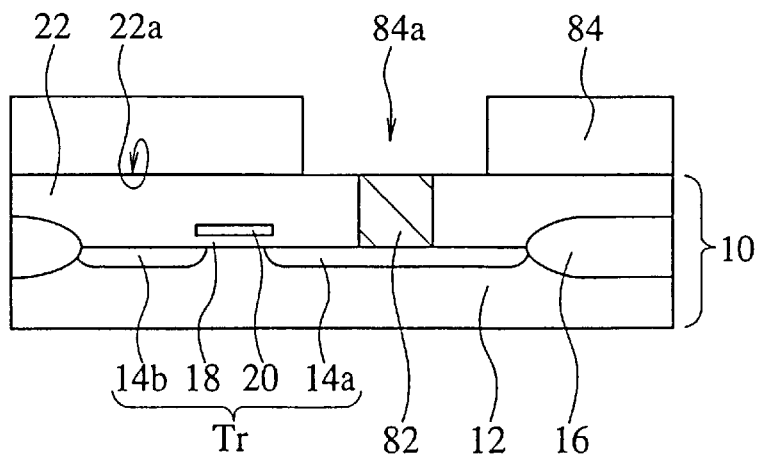

After that, on this plug electrode 82 and on the upper surface of the surface insulating layer 22 is formed a dummy insulating film (also called a dummy layer) 84 having a fourth opening 84a, using a photolithographic etching technique (FIG. 4(C)). In this case, unlike the first opening 24a in the first, second, and third embodiments (cf FIG. 1(B)), this fourth opening 84a is formed at a position wherewith the upper surface of the plug electrode 82 is exposed.

Figure 4D:
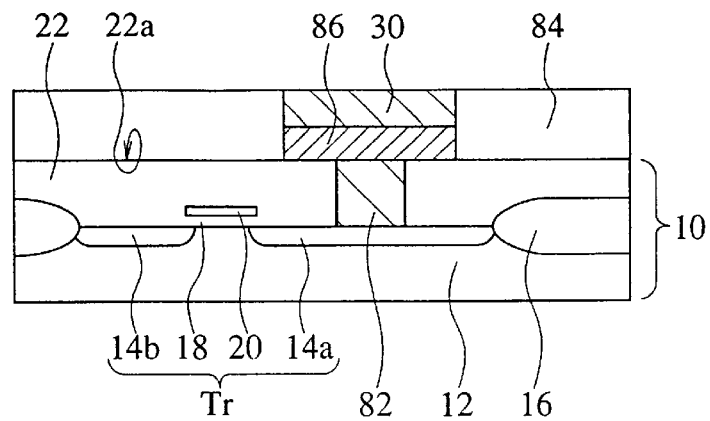

After that, the barrier layer 86 and first electrode 30 are formed successively inside the fourth opening 84a to yield the structure as shown in FIG. 4(D). The barrier layer 86 can be formed, for example, using a CMP technique, after forming a preparatory barrier layer by sputtering. The first electrode 30, moreover, as in the first embodiment, can be formed by sputtering and a CMP technique. However, the method used for forming the laminar structure of the barrier layer 86 and the first electrode 30 may also be one wherewith the barrier layer 86 and a preparatory layer for the first electrode 30 are formed and both layers are then polished by CMP in a single operation. The materials that may be used for the barrier layer in this case include, for example, TiN, TiW, Ta, and TaSiN. This barrier layer is formed so that, during the annealing that is performed for crystallizing the ferroelectric film in a later process step, the plug electrode will not be oxidized by oxygen being diffused by the high-temperature process in the oxygen atmosphere.

It has also been reported that an iridium (Ir) layer will prevent oxygen penetration. Accordingly, if iridium (Ir) is selected for the material of the first electrode 30, it is believed that the first electrode itself will prevent the intrusion of oxygen even if the barrier layer 86 is not provided.

Figure 4E:
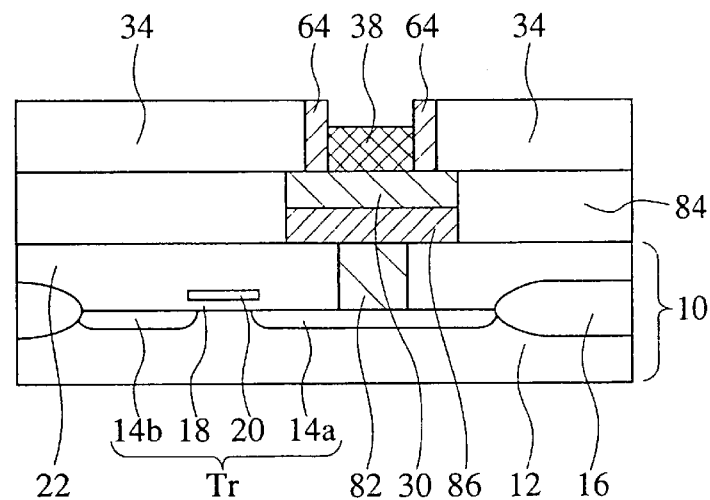

After that, the barrier layer 64 and the ferroelectric layer 38 are formed inside the second opening 34a formed on the second interlayer insulating film 34 through the same processes (cf. FIG. 2(B) to FIG. 2(F)) as were described for the second embodiment (FIG. 4(E)). That is, a structure is obtained wherein the ferroelectric film 38 is formed contacting the first electrode 30, and the barrier layer 64 is formed between the ferroelectric film 38 and the second interlayer insulating film 34. The material for this ferroelectric film 38 and the material for the barrier layer 64 can be made the same as the materials described for the first and second embodiments.

Figure 4F:
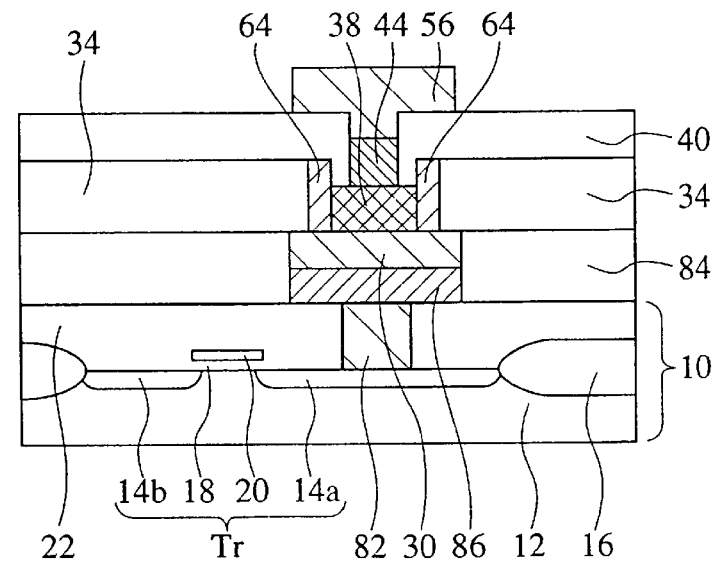

After that, the second electrode 44 that makes contact with the ferroelectric film 38 is formed inside the third opening 40a of the third interlayer insulating film 40 through the same processes as were described for the first or the second embodiment (cf. FIG. 1(I) to FIG. 1(L) or FIG. 2(G) to FIG. 2(I)), and, thereafter, the wiring or interconnection pattern 56 is formed (FIG. 4(F)).

According to the fourth embodiment described in the foregoing, a metal layer is formed, using a CMP technique, as the barrier layer 86, immediately below the first electrode 30. Accordingly, the number of process steps involved in fabricating the ferroelectric memory cell is reduced. Furthermore, deterioration in the electric characteristics of the plug electrode 82 during the annealing process for crystallizing the ferroelectric film is prevented by the barrier layer 86, wherefore the electrical connection between the plug electrode and the first electrode is made good. According to this fourth embodiment, moreover, the plug electrode, and hence the ferroelectric capacitor, can be formed in closer proximity to the MOS transistor, thereby making it possible to effect an even greater reduction in cell surface area in the ferroelectric memory cell.

The processes in this fourth embodiment naturally can be applied to 1T1C memories, 2T2C memories, or shrink memories.

The embodiments described in the foregoing are nothing other than preferred embodiments of the present invention. Therefore, the present invention is in no way limited to the embodiments described in the foregoing. The present invention can be modified and altered in many ways. For example, if the annealing temperature for crystallizing the ferroelectric film is 600° C. or lower, there is no need to form the barrier layers described in the foregoing.

As is evident also from the embodiments described in the foregoing, according to the present invention, a first electrode and a ferroelectric film are formed using a CMP process. As a consequence, the present invention can provide the following benefits.

(a) There is no danger of a build-up of non-volatile reaction products.

(b) Because minute or fine openings and holes can be formed by dry etching in the interlayer insulating film, it is easy to make the first and second electrodes and the ferroelectric film formed inside them minute.

(c) Because mechanical damage to the ferroelectric film can be effectively checked, the ferroelectric characteristics can be stably reproduced and reliability can be improved.

Also, by forming the second electrode with an ordinary photolithographic etching process, it is possible to realize greater matching tolerance with the ferroelectric film therebelow.

What is claimed is:

1. A method for fabricating a ferroelectric memory cell having first and second electrodes and a ferroelectric film interposed between said first and second electrodes, comprising:

forming a preparatory first electrode layer on an upper surface side of an underlayer;

removing a portion of said preparatory first electrode layer by a first chemical mechanical polishing, to form said first electrode from a remaining portion of said preparatory first electrode layer;

forming a preparatory ferroelectric film on the upper surface side of said underlayer, wherein a portion of said preparatory ferroelectric film contacts said first electrode; and removing a portion of said preparatory ferroelectric film not in contact with said first electrode by a second chemical mechanical polishing, to form said ferroelectric film from a remaining portion of said preparatory ferroelectric film, wherein a slurry used during said second chemical mechanical polishing is an ammonia-based aqueous solution and said preparatory ferroelectric film is an $SrBr_2Ta_2O_9$ film.

2. The method for fabricating a ferroelectric memory cell according to claim 1, further comprising:

forming a preparatory second electrode layer on the upper surface side of said underlayer, wherein a portion of said preparatory second electrode layer contacts said ferroelectric film; and removing a portion of said preparatory second electrode layer not in contact with said ferroelectric film by a third chemical mechanical polishing, to form said second electrode from a remaining portion of said preparatory second electrode layer.

3. The method for fabricating a ferroelectric memory cell according to claim 1, further comprising:

forming a preparatory second electrode layer on the upper surface side of said underlayer, wherein a portion of said preparatory second electrode layer contacts said ferroelectric film; and removing a portion of said preparatory second electrode layer not in contact with said ferroelectric film by a photolithograhic etching, to form said second electrode from a remaining portion of said preparatory second electrode layer.

4. The method for fabricating a ferroelectric memory cell according to claim 1, wherein said underlayer has a transistor formed internally therein for controlling operation of the ferroelectric memory cell and has a surface insulating layer as a first interlayer insulating film on the upper surface side of said underlayer that said preparatory first electrode layer is formed on.

5. The method for fabricating a ferroelectric memory cell according to claim 1, wherein said forming a preparatory first electrode layer comprises:

forming on said underlayer by photolithographic etching, a dummy insulating layer having a first opening that exposes an intended region for formation of said first electrode on the upper surface side of said underlayer; and sputtering a first electrode material on a surface of said dummy insulating layer and on an exposed surface of said underlayer, to form said preparatory first electrode layer, said removing a portion of said preparatory first electrode layer comprises polishing said dummy insulating layer and said preparatory first electrode layer until a polished surface of said dummy insulating layer and an upper surface of said remaining portion of said preparatory first electrode layer are flat and co-planar surfaces.

6. The method for fabricating a ferroelectric memory cell according to claim 5, wherein said forming a preparatory ferroelectric film comprises:

forming on said flat and co-planar surfaces by photolithographic etching, a second interlayer insulating film having a second opening that exposes said first electrode; and coating a ferroelectric material on a surface of said second interlayer insulating film and on an exposed surface of said first electrode, to form said preparatory ferroelectric film, a height difference between an upper surface of said second interlayer insulating film and said exposed surface of said first electrode being larger than a thickness of said preparatory ferroelectric film, said ferroelectric film being formed by removing said second interlayer insulating film and said portion of said preparatory ferroelectric film by said second chemical mechanical polishing, to a level that does not reach an upper surface of said preparatory ferroelectric film formed on said exposed surface of said first electrode.

7. The method for fabricating a ferroelectric memory cell according to claim 5, wherein said forming a preparatory ferroelectric film comprises:

forming on said flat and co-planar surfaces by photolithographic etching, a second interlayer insulating film having a second opening that exposes said first electrode;

forming a preparatory barrier layer on a surface of said second interlayer insulating film; and coating a ferroelectric material on an upper surface of said preparatory barrier layer and on an exposed surface of said first electrode, to form a preparatory ferroelectric film, a thickness of said preparatory ferroelectric film being greater than a height difference between an upper surface of said second interlayer insulating film and said exposed surface of said first electrode, said ferroelectric film being formed by removal of said preparatory ferroelectric film on said preparatory barrier layer, said preparatory barrier layer, and said second intelayer insulating film by said second chemical mechanical polishing, to a level that does not reach an upper surface of a portion of said preparatory ferroelectric film formed on the exposed surface of said first electrode, so that simultaneously therewith, a barrier layer is formed from a remaining portion of said preparatory barrier layer.

8. A method for fabricating a ferroelectric memory cell having first and second electrodes and a ferroelectric film interposed between said first and second electrodes, comprising:

forming a preparatory first electrode layer on an upper surface side of an underlayer;

removing a portion of said preparatory first electrode layer by a first chemical mechanical polishing, to form said first electrode from a remaining portion of said preparatory first electrode layer;

forming a preparatory ferroelectric film on the upper surface side of said underlayer, wherein a portion of said preparatory ferroelectric film contacts said first electrode; and removing a portion of said preparatory ferroelectric film not in contact with said first electrode by a second chemical mechanical polishing, to form said ferroelectric film from a remaining portion of said preparatory ferroelectric film, wherein a slurry used during said second chemical mechanical polishing is a hydrochloric acid-based aqueous solution and said preparatory first electrode layer is a platinum layer.

9. The method for fabricating a ferroelectric memory cell according to claim 8, further comprising:

forming a preparatory second electrode layer on the upper surface side of said underlayer, wherein a portion of said preparatory second electrode layer contacts said ferroelectric film; and removing a portion of said preparatory second electrode layer not in contact with said ferroelectric film by a third chemical mechanical polishing, to form said second electrode from a remaining portion of said preparatory second electrode layer.

10. The method for fabricating a ferroelectric memory cell according to claim 8, further comprising:

forming a preparatory second electrode layer on the upper surface side of said underlayer, wherein a portion of said preparatory second electrode layer contacts said ferroelectric film; and removing a portion of said preparatory second electrode layer not in contact with said ferroelectric film by a photolithograhic etching, to form said second electrode from a remaining portion of said preparatory second electrode layer.

11. The method for fabricating a ferroelectric memory cell according to claim 8, wherein said underlayer has a transistor formed internally therein for controlling operation of the ferroelectric memory cell and has a surface insulating layer as a first interlayer insulating film on the upper surface side of said underlayer that said preparatory first electrode layer is formed on.

12. The method for fabricating a ferroelectric memory cell according to claim 8, wherein said forming a preparatory first electrode layer comprises:

forming on said underlayer by photolithographic etching, a dummy insulating layer having a first opening that exposes an intended region for formation of said first electrode on the upper surface side of said underlayer; and sputtering a first electrode material on a surface of said dummy insulating layer and on an exposed surface of said underlayer, to form said preparatory first electrode layer, said removing a portion of said preparatory first electrode layer comprises polishing said dummy insulating layer and said preparatory first electrode layer until a polished surface of said dummy insulating layer and an upper surface of said remaining portion of said preparatory first electrode layer are flat and co-planar surfaces.

13. The method for fabricating a ferroelectric memory cell according to claim 12, wherein said forming a preparatory ferroelectric film comprises:

forming on said flat and co-planar surfaces by photolithographic etching, a second interlayer insulating film having a second opening that exposes said first electrode; and coating a ferroelectric material on a surface of said second interlayer insulating film and on an exposed surface of said first electrode, to form said preparatory ferroelectric film, a height difference between an upper surface of said second interlayer insulating film and said exposed surface of said first electrode being larger than a thickness of said preparatory ferroelectric film, said ferroelectric film being formed by removing said second interlayer insulating film and said portion of said preparatory ferroelectric film by said second chemical mechanical polishing, to a level that does not reach an upper surface of said preparatory ferroelectric film formed on said exposed surface of said first electrode.

14. The method for fabricating a ferroelectric memory cell according to claim 12, wherein said forming a preparatory ferroelectric film comprises:

forming on said flat and co-planar surfaces by photolithographic etching, a second interlayer insulating film having a second opening that exposes said first electrode;

forming a preparatory barrier layer on a surface of said second interlayer insulating film; and coating a ferroelectric material on an upper surface of said preparatory barrier layer and on an exposed surface of said first electrode, to form a preparatory ferroelectric film, a thickness of said preparatory ferroelectric film being greater than a height difference between an upper surface of said second interlayer insulating film and said exposed surface of said first electrode, said ferroelectric film being formed by removal of said preparatory ferroelectric film on said preparatory barrier layer, said preparatory barrier layer, and said second interlayer insulating film by said second chemical mechanical polishing, to a level that does not reach an upper surface of a portion of said preparatory ferroelectric film formed on the exposed surface of said first electrode, so that simultaneously therewith, a barrier layer is formed from a remaining portion of said preparatory barrier layer.

15. A method for fabricating a ferroelectric memory cell having first and second electrodes and a ferroelectric film interposed between said first and second electrodes, comprising:

forming a preparatory first electrode layer on an upper surface side of an underlayer;

removing a portion of said preparatory first electrode layer by a first chemical mechanical polishing, to form said first electrode from a remaining portion of said preparatory first electrode layer;

forming a preparatory ferroelectric film on the upper surface side of said underlayer, wherein a portion of said preparatory ferroelectric film contacts said first electrode;

removing a portion of said preparatory ferroelectric film not in contact with said first electrode by a second chemical mechanical polishing, to form said ferroelectric film from a remaining portion of said preparatory ferroelectric film;

forming a preparatory second electrode layer on the upper surface of said underlayer, wherein a portion of said preparatory second electrode layer contacts said ferroelectric film; and removing a portion of said preparatory second electrode layer not in contact with said ferroelectric film by a third chemical mechanical polishing, to form said second electrode from a remaining portion of said preparatory second electrode layer, wherein a slurry used during said third chemical mechanical polishing is a hydrochloric acid-based aqueous solution and said second electrode layer is a platinum layer.

16. The method for fabricating a ferroelectric memory cell according to claim 15, wherein said underlayer has a transistor formed internally therein for controlling operation of the ferroelectric memory cell and has a surface insulating layer as a first interlayer insulating film on the upper surface side of said underlayer that said preparatory first electrode layer is formed on.

17. The method for fabricating a ferroelectric memory cell according to claim 15, wherein said forming a preparatory first electrode layer comprises:

forming on said underlayer by photolithographic etching, a dummy insulating layer having a first opening that exposes an intended region for formation of said first electrode on the upper surface side of said underlayer; and sputtering a first electrode material on a surface of said dummy insulating layer and on an exposed surface of said underlayer, to form said preparatory first electrode layer, said removing a portion of said preparatory first electrode layer comprises polishing said dummy insulating layer and said preparatory first electrode layer until a polished surface of said dummy insulating layer and an upper surface of said remaining portion of said preparatory first electrode layer are flat and co-planar surfaces.

18. The method for fabricating a ferroelectric memory cell according to claim 17, wherein said forming a preparatory ferroelectric film comprises:

forming on said flat and co-planar surfaces by photolithographic etching, a second interlayer insulating film having a second opening that exposes said first electrode; and coating a ferroelectric material on a surface of said second interlayer insulating film and on an exposed surface of said first electrode, to form said preparatory ferroelectric film, a height difference between an upper surface of said second interlayer insulating film and said exposed surface of said first electrode being larger than a thickness of said preparatory ferroelectric film, said ferroelectric film being formed by removing said second interlayer insulating film and said portion of said preparatory ferroelectric film by said second chemical mechanical polishing, to a level that does not reach an upper surface of said preparatory ferroelectric film formed on said exposed surface of said first electrode.

19. The method for fabricating a ferroelectric memory cell according to claim 17, wherein said forming a preparatory ferroelectric film comprises:

forming on said flat and co-planar surfaces by photolithographic etching, a second interlayer insulating film having a second opening that exposes said first electrode;

forming a preparatory barrier layer on a surface of said second interlayer insulating film; and coating a ferroelectric material on an upper surface of said preparatory barrier layer and on an exposed surface of said first electrode, to form a preparatory ferroelectric film, a thickness of said preparatory ferroelectric film being greater than a height difference between an upper surface of said second interlayer insulating film and said exposed surface of said first electrode, said ferroelectric film being formed by removal of said preparatory ferroelectric film on said preparatory barrier layer, said preparatory barrier layer, and said second interlayer insulating film by said second chemical mechanical polishing, to a level that does not reach an upper surface of a portion of said preparatory ferroelectric film formed on the exposed surface of said first electrode, so that simultaneously therewith, a barrier layer is formed from a remaining portion of said preparatory barrier layer.

20. A method for fabricating a ferroelectric memory cell having first and second electrodes and a ferroelectric film interposed between said first and second electrodes, comprising:

forming a preparatory first electrode layer on an upper surface side of an underlayer;

removing a portion of said preparatory first electrode layer by a first chemical mechanical polishing, to form said first electrode from a remaining portion of said preparatory first electrode layer;

forming a preparatory ferroelectric film on the upper surface side of said underlayer, wherein a portion of said preparatory ferroelectric film contacts said first electrode;

removing a portion of said preparatory ferroelectric film not in contact with said first electrode by a second chemical mechanical polishing, to form said ferroelectric film from a remaining portion of said preparatory ferroelectric film;

forming a preparatory second electrode layer on the upper surface side of said underlayer, wherein a portion of said preparatory second electrode layer contacts said ferroelectric film;

removing a portion of said preparatory second electrode layer not in contact with said ferroelectric film by a third chemical mechanical polishing, to form said second electrode from a remaining portion of said preparatory second electrode layer, wherein forming a preparatory first electrode layer comprises forming on said underlayer by photolithographic etching, a dummy insulating layer having a first opening that exposes a region intended for formation of said first electrode on the upper surface of said underlayer, by a photolithographic etching technique, and sputtering a first electrode material on a surface of said dummy insulating layer and on an exposed surface of said underlayer, to form said preparatory first electrode layer, said removing a portion of said preparatory first electrode layer comprises polishing said dummy insulating layer and said preparatory first electrode layer until a polished surface of said dummy insulating layer and an upper surface of said remaining portion of said preparatory first electrode layer are flat and co-planar surfaces, wherein said forming a preparatory ferroelectric film comprises forming on said flat and co-planar surfaces by photolithographic etching, a second interlayer insulating film having a second opening that exposes said first electrode, and coating a ferroelectric material on a surface of said second interlayer insulating film on an exposed surface of said first electrode, to form said preparatory ferroelectric film, a height difference between an upper surface of said second interlayer insulating film and said exposed surface of said first electrode being larger than a thickness of said preparatory ferroelectric film, said ferroelectric film being formed by removing said second interlayer insulating film and said portion of said preparatory ferroelectric film by said second chemical mechanical polishing, to a level that does not reach an upper surface of said preparatory ferroelectric film formed on said exposed surface of said first electrode, and wherein said forming a preparatory second electrode layer comprises forming on a remaining portion of said second interlayer insulating film and on said ferroelectric film by photolithographic etching, a third interlayer insulating film having a third opening that exposes a region intended for formation of said second electrode on an upper surface of said ferroelectric film, and sputtering a second electrode material on a surface of said third interlayer insulating film and on an exposed surface of said ferroelectric film, to form said preparatory second electrode, said removing a portion of said preparatory second electrode layer comprises polishing said third interlayer insulating film and said preparatory second electrode to a level that does not reach to an upper surface of a remaining portion of said preparatory second electrode layer formed on said exposed surface of said ferroelectric film.

21. The method for fabricating a ferroelectric memory cell according to claim 20, wherein said underlayer has a transistor formed internally therein for controlling operation of the ferroelectric memory cell and has a surface insulating layer as a first interlayer insulating film on the upper surface side of said underlayer that said preparatory first electrode layer is formed on.

22. A method for fabricating a ferroelectric memory cell having first and second electrodes and a ferroelectric film interposed between said first and second electrodes, comprising:

forming a preparatory first electrode layer on an upper surface side of an underlayer;

removing a portion of said preparatory first electrode layer by a first chemical mechanical polishing, to form said first electrode from a remaining portion of said preparatory first electrode layer;

forming a second interlayer insulating film having a second opening that exposes said first electrode;

forming a preparatory barrier layer on a surface of said second interlayer insulating film;

forming a preparatory ferroelectric film on an upper surface side of said preparatory barrier layer and on an exposed surface of said first electrode, wherein a portion of said preparatory ferroelectric film contacts said first electrode; and removing a portion of said preparatory ferroelectric film and a portion of said preparatory barrier layer not in contact with said first electrode by a second chemical mechanical polishing, to form said ferroelectric film from a remaining portion of said preparatory ferroelectric film and to form a barrier layer between said ferroelectric film and said second interlayer insulating film from a remaining portion of said preparatory barrier layer.

23. The method for fabricating a ferroelectric memory cell according to claim 22, further comprising:

forming a preparatory second electrode layer on the upper surface side of said underlayer, wherein a portion of said preparatory second electrode layer contacts said ferroelectric film; and removing a portion of said preparatory second electrode layer not in contact with said ferroelectric film by a third chemical mechanical polishing, to form said second electrode from a remaining portion of said preparatory second electrode layer.

24. The method for fabricating a ferroelectric memory cell according to claim 22, further comprising:

forming a preparatory second electrode layer on the upper surface side of said underlayer, wherein a portion of said preparatory second electrode layer contacts said ferroelectric film; and removing a portion of said preparatory second electrode layer not in contact with said ferroelectric film by a photolithograhic etching, to form said second electrode from a remaining portion of said preparatory second electrode layer.

25. The method for fabricating a ferroelectric memory cell according to claim 22, wherein said underlayer has a transistor formed internally therein for controlling operation of the ferroelectric memory cell and has a surface insulating layer as a first interlayer insulating film on the upper surface side of said underlayer that said preparatory first electrode layer is formed on.

26. The method for fabricating a ferroelectric memory cell according to claim 22, wherein said forming a preparatory first electrode layer comprises:

forming on said underlayer by photolithographic etching, a dummy insulating layer having a first opening that exposes an intended region for formation of said first electrode on the upper surface side of said underlayer; and sputtering a first electrode material on a surface of said dummy insulating layer and on an exposed surface of said underlayer, to form said preparatory first electrode layer, said removing a portion of said preparatory first electrode layer comprises polishing said dummy insulating layer and said preparatory first electrode layer until a polished surface of said dummy insulating layer and an upper surface of said remaining portion of said preparatory first electrode layer are flat and co-planar surfaces.

27. The method for fabricating a ferroelectric memory cell according to claim 26, wherein said forming a preparatory ferroelectric film comprises:

coating a ferroelectric material on the upper surface of said preparatory barrier layer and on the exposed surface of said first electrode, to form said preparatory ferroelectric film, a height difference between an upper surface of said preparatory barrier layer and said exposed surface of said first electrode being larger than a thickness of said preparatory ferroelectric film, and said ferroelectric film being formed by removing said second interlayer insulating film, said preparatory barrier layer, and said portion of said preparatory ferroelectric film by said second chemical mechanical polishing, to a level that does not reach an upper surface of said preparatory ferroelectric film formed on said exposed surface of said first electrode.

* * * * *